(12) United States Patent
Cha

(10) Patent No.: US 10,993,338 B2
(45) Date of Patent: Apr. 27, 2021

(54) FLEXIBLE DISPLAY DEVICE

(71) Applicant: LG ELECTRONICS INC., Seoul (KR)

(72) Inventor: Youngdo Cha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/728,336

(22) Filed: Dec. 27, 2019

(65) Prior Publication Data

US 2020/0253068 A1    Aug. 6, 2020

Related U.S. Application Data

(60) Provisional application No. 62/799,705, filed on Jan. 31, 2019.

(30) Foreign Application Priority Data

Apr. 3, 2019  (KR) ........................ 10-2019-0039173
May 8, 2019  (KR) ........................ 10-2019-0053851

(51) Int. Cl.
  *G06F 1/16*  (2006.01)
  *H05K 5/02*  (2006.01)
  *H05K 5/00*  (2006.01)

(52) U.S. Cl.
  CPC ......... *H05K 5/0226* (2013.01); *H05K 5/0017* (2013.01)

(58) Field of Classification Search
  CPC ............................ G06F 1/1681; G06F 1/1652
  USPC ........................................ 361/679.26, 679.27
  See application file for complete search history.

(56) References Cited

U.S. PATENT DOCUMENTS

| | | | |
|---|---|---|---|
| 9,204,565 B1 | 12/2015 | Lee et al. | |
| 9,483,081 B2 | 11/2016 | Lee et al. | |
| 9,572,272 B2* | 2/2017 | Lee | H05K 5/0021 |
| 9,992,888 B2* | 6/2018 | Moon | G06F 1/1618 |
| 10,008,135 B2 | 6/2018 | Lim | |
| 10,185,367 B2 | 1/2019 | Kim | |
| 10,216,224 B2 | 2/2019 | Ahn et al. | |
| 10,229,629 B2 | 3/2019 | Yang et al. | |
| 10,306,783 B2 | 5/2019 | Seo et al. | |

(Continued)

FOREIGN PATENT DOCUMENTS

EP    3349422 A1    7/2018
KR    10-1452868 B1    10/2014

(Continued)

*Primary Examiner* — Anthony Q Edwards
(74) *Attorney, Agent, or Firm* — Birch, Stewart, Kolasch & Birch, LLP

(57) ABSTRACT

A flexible display device including a first body; a second body; a flexible display unit arranged on a front surface of the first body and the second body; and a hinge unit connecting the first body and the second body to each other such that the first body and the second body can be folded and unfolded with respect to each other. Further, the hinge unit includes a plurality of hinge segments such that in a folding state of the flexible display unit, the second body is arranged to cover a rear surface of the first body as an interval between the hinge segments is increased, and in an unfolded state of the flexible display unit, the first body and the second body are arranged in parallel with the interval between the hinge segments being decreased.

20 Claims, 14 Drawing Sheets

(56) References Cited

U.S. PATENT DOCUMENTS

| | | | |
|---|---|---|---|
| 10,338,641 B2 | 7/2019 | Xia et al. | |
| 10,383,241 B2 | 8/2019 | Lin | |
| 10,426,051 B2* | 9/2019 | Brand | H05K 5/0226 |
| 10,694,623 B2* | 6/2020 | Park | H05K 5/0017 |
| 2010/0053071 A1 | 3/2010 | Cohen et al. | |
| 2012/0002360 A1* | 1/2012 | Seo | G06F 1/1652 |
| | | | 361/679.01 |
| 2012/0044620 A1* | 2/2012 | Song | G06F 1/1681 |
| | | | 361/679.01 |
| 2012/0314399 A1* | 12/2012 | Bohn | G06F 1/1652 |
| | | | 362/97.1 |
| 2012/0314400 A1* | 12/2012 | Bohn | H01L 51/5237 |
| | | | 362/97.1 |
| 2013/0058063 A1 | 3/2013 | O'Brien | |
| 2014/0211399 A1 | 3/2014 | O'Brien | |
| 2014/0226275 A1* | 8/2014 | Ko | G06F 1/1681 |
| | | | 361/679.27 |
| 2015/0055287 A1* | 2/2015 | Seo | G06F 1/1679 |
| | | | 361/679.27 |
| 2016/0070303 A1 | 3/2016 | Lee et al. | |
| 2017/0038798 A1* | 2/2017 | Lee | G06F 1/1616 |
| 2017/0243526 A1 | 8/2017 | Lim | |
| 2018/0049336 A1* | 2/2018 | Manuel | E05F 3/20 |
| 2018/0070460 A1* | 3/2018 | Han | G06F 1/1626 |
| 2018/0077810 A1 | 3/2018 | Moon et al. | |
| 2018/0174497 A1 | 6/2018 | Lim | |
| 2018/0198896 A1 | 7/2018 | Kang et al. | |
| 2018/0234530 A1 | 8/2018 | Lee et al. | |
| 2019/0082544 A1 | 3/2019 | Park | |
| 2019/0132947 A1* | 5/2019 | Koo | H05K 1/0281 |
| 2019/0243424 A1 | 8/2019 | Lee et al. | |
| 2019/0320048 A1 | 10/2019 | Yang et al. | |
| 2019/0380218 A1 | 12/2019 | Moon et al. | |
| 2020/0029449 A1 | 1/2020 | Makinen et al. | |
| 2020/0120821 A1 | 4/2020 | Brand | |
| 2020/0137907 A1 | 4/2020 | Kang et al. | |
| 2020/0170128 A1 | 5/2020 | Kim | |

FOREIGN PATENT DOCUMENTS

| | | |
|---|---|---|
| KR | 10-2017-0026023 A | 3/2017 |
| KR | 10-1784880 B1 | 10/2017 |
| KR | 10-2018-0064492 A | 6/2018 |
| KR | 10-2018-0107358 A | 10/2018 |
| KR | 10-2019-0004618 A | 1/2019 |
| WO | WO 2017/211115 A1 | 12/2017 |
| WO | WO 2018/186631 A1 | 10/2018 |

* cited by examiner

FLEXIBLE DISPLAY DEVICE

CROSS-REFERENCE TO RELATED APPLICATIONS

Pursuant to 35 U.S.C. § 119(e), this application claims the benefit of an earlier filing date and priority to U.S. Provisional Application No. 62/799,705 filed on Jan. 31, 2019, and under 35 U.S.C. § 119(a) to Korean Application Nos. 10-2019-0053851 filed in the Republic of Korea on May 8, 2019 and 10-2019-0039173 filed in the Republic of Korea on Apr. 3, 2019, all of which are hereby expressly incorporated by reference into the present application.

BACKGROUND OF THE INVENTION

1. Field of the Invention

The present disclosure relates to a flexible display device, and particularly, to a flexible display device having a flexible display unit which is transformable by an external force.

2. Discussion of the Related Art

A portable electronic device (hereinafter, a mobile terminal) such as a communication terminal, a multimedia device, a portable computer, a game machine and a capturing device is provided with a display for displaying video information. The mobile terminal may have a folding structure to be folded into a smaller size, for convenience of portability. In such an electronic device, two bodies are connected to each other by a folding structure (e.g., a hinge unit).

Since the conventional display has no folding structure, it was impossible to implement a structure to arrange a display on two bodies connected to each other in a foldable manner. Therefore, it was impossible to apply a large screen to an electronic device of a folding structure.

However, as a flexible display which can be bent is being developed recently, research to apply such a flexible display to a mobile terminal is actively ongoing. In this instance, since the flexible display is arranged on two bodies through a folding structure, a large screen can be implemented.

In a flexible display device, a flexible display is transformable into a folding state and an unfolding state by using a hinge unit. However, when the folding state is converted into the unfolding state or vice versa, an unnecessary load may be applied to the flexible display, or a folding in a reverse direction may be performed to cause inconvenience to a user.

Therefore, there is provided a mechanism of a flexible display device, capable of having a display long in a vertical direction in a folding state for utilization as a smart phone, and having a screen ratio of about 1:1 in an unfolding state. Here, considered is a method for providing a smooth movement of a flexible display unit for implementation of various states.

SUMMARY OF THE INVENTION

Therefore, an aspect of the detailed description is to provide a flexible display device which can perform folding and unfolding, and which can provide a display unit of various sizes to a user, for utilization as a mobile phone, a note and a tablet.

Another aspect of the detailed description is to provide a flexible display device which can perform a smooth movement by folding and unfolding of a flexible display unit, which can smoothly support the flexible display unit in spite of a state change of the flexible display unit, and which can prevent an unnecessary load from being applied to the flexible display unit.

To achieve these and other advantages and in accordance with the purpose of this specification, as embodied and broadly described herein, a flexible display device has a structure that one body has one side to which another body is rotatably connected, and a flexible display unit is foldable.

More specifically, a flexible display device includes: a first body having a plurality of parts connected to each other so as to be relatively moveable; a second body connected to the first body so as to be relatively rotatable; a flexible display unit formed to be folded and unfolded, and arranged on a front surface of the first body and the second body; and a hinge unit installed at one side of the first body, configured to connect the first body and the second body to each other for relative rotation, and formed of a plurality of hinge segments, wherein in a folding state of the flexible display unit, the second body may be arranged to cover a rear surface of the first body as an interval between the hinge segments is changed.

Advantageous Effects

Effects of the present disclosure obtained by the aforementioned solution means are as follows. Firstly, the flexible display unit having two screen sizes of a folding state and an unfolding state can be implemented through a foldable structure. Secondly, through an interworking structure of the bodies, a connection operation of a folding state and an unfolding state can be implemented in a compact space.

Thirdly, through a configuration of the rear plate, the flexible display unit can be smoothly supported. Also, since a length compensation can be performed when the flexible display unit is bent, damage of the flexible display unit can be prevented at the time of a folding operation and an unfolding operation.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

Although the terms first, second, etc. may be used herein to describe various elements, these elements should not be limited by these terms. These terms are generally only used to distinguish one element from another. When an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Display devices presented herein may be implemented using a variety of different types of terminals. Examples of such devices include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like. Hereinafter, for convenience of description, the mobile terminal will be described as one example of a flexible display device.

Figure 1:
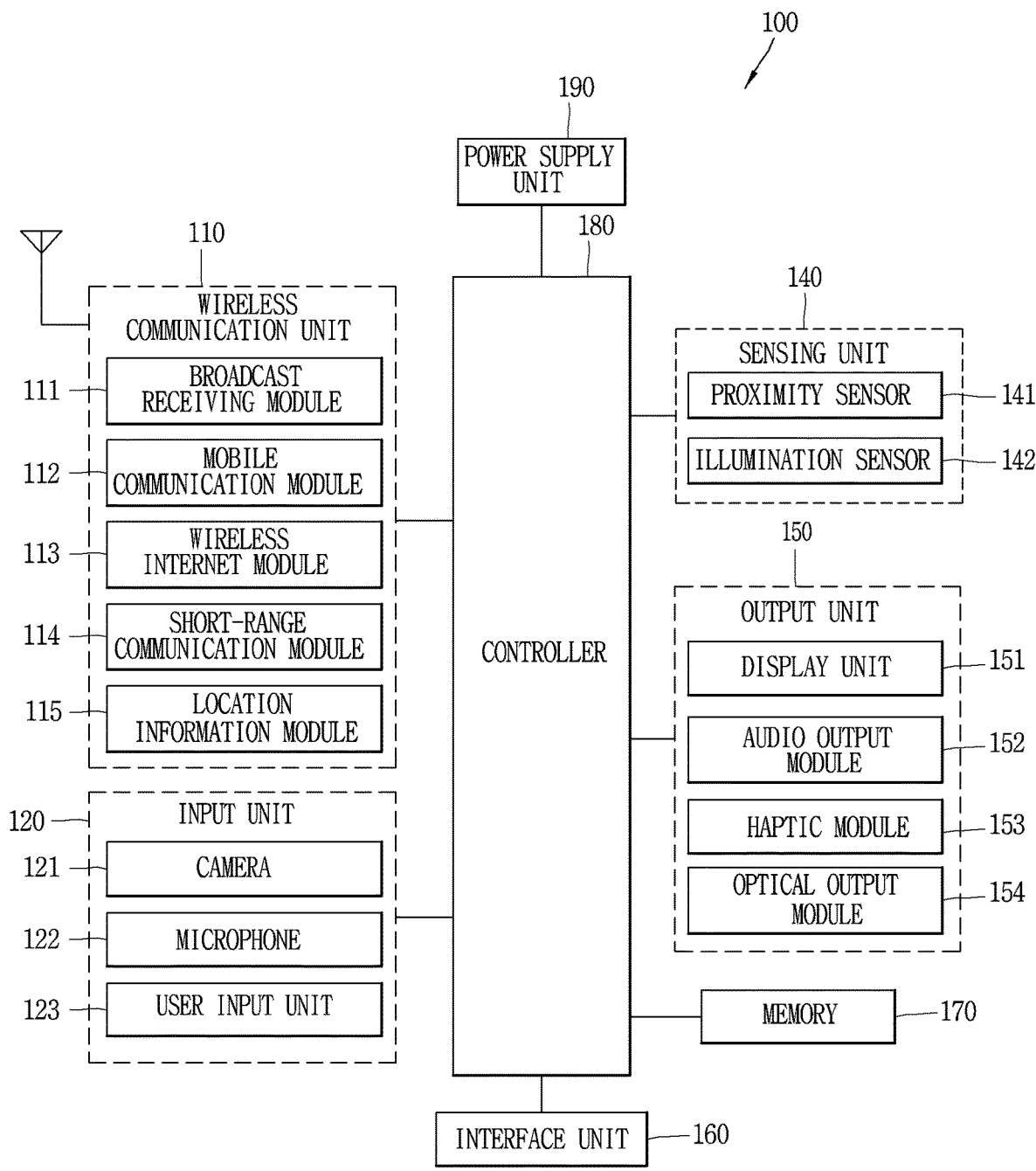
FIG. 1 is a block diagram illustrating a mobile terminal according to the present disclosure.

FIG. 1 is a block diagram of a mobile terminal in accordance with the present disclosure. The mobile terminal 100 may be shown having components such as a wireless communication unit 110, an input unit 120, a sensing unit 140, an output unit 150, an interface unit 160, a memory 170, a controller (or control unit) 180, and a power supply unit 190. Implementing all of the illustrated components is not a requirement. Greater or fewer components may alternatively be implemented.

In more detail, the wireless communication unit 110 may typically include one or more modules which permit communications such as wireless communications between the mobile terminal 100 and a wireless communication system, communications between the mobile terminal 100 and another mobile terminal, or communications between the mobile terminal 100 and an external server. Further, the wireless communication unit 110 may typically include one or more modules which connect the mobile terminal 100 to one or more networks.

The wireless communication unit 110 may include one or more of a broadcast receiving module 111, a mobile communication module 112, a wireless Internet module 113, a short-range communication module 114, and a location information module 115. The input unit 120 may include a camera 121 or an image input unit for obtaining images or video, a microphone 122, which is one type of audio input device for inputting an audio signal, and a user input unit 123 (for example, a touch key, a mechanical key, and the like) for allowing a user to input information. Data (for example, audio, video, image, and the like) may be obtained by the input unit 120 and may be analyzed and processed according to user commands.

The sensing unit 140 may typically be implemented using one or more sensors configured to sense internal information of the mobile terminal, the surrounding environment of the mobile terminal, user information, and the like. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like). The mobile terminal disclosed herein may be configured to utilize information obtained from one or more sensors of the sensing unit 140, and combinations thereof.

The output unit 150 may typically be configured to output various types of information, such as audio, video, tactile output, and the like. The output unit 150 may be shown having at least one of a display unit 151, an audio output module 152, a haptic module 153, and an optical output module 154. The display unit 151 may have an inter-layered structure or an integrated structure with a touch sensor in order to implement a touch screen. The touch screen may function as the user input unit 123 which provides an input interface between the mobile terminal 100 and the user and simultaneously provide an output interface between the mobile terminal 100 and a user.

The interface unit 160 serves as an interface with various types of external devices that are coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). Application programs may be stored in the memory 170, installed in the mobile terminal 100, and executed by the controller 180 to perform an operation (or function) for the mobile terminal 100.

The controller 180 typically functions to control an overall operation of the mobile terminal 100, in addition to the operations associated with the application programs. The controller 180 can provide or process information or functions appropriate for a user by processing signals, data, information and the like, which are input or output by the aforementioned various components, or activating application programs stored in the memory 170.

Also, the controller 180 can control at least some of the components illustrated in FIG. 1, to execute an application program that have been stored in the memory 170. In addition, the controller 180 can control at least two of those components included in the mobile terminal 100 to activate the application program.

The power supply unit 190 may be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least part of the components may cooperatively operate to implement an operation, a control or a control method of a mobile terminal according to various embodiments disclosed herein. Also, the operation, the control or the control method of the mobile terminal may be implemented on the mobile terminal by an activation of at least one application program stored in the memory 170.

Hereinafter, description will be given in more detail of the aforementioned components with reference to FIG. 1, prior to describing various embodiments implemented through the mobile terminal 100. First, regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules may be utilized to facilitate simultaneous reception of two or more broadcast channels, or to support switching among broadcast channels.

The broadcast management server may be a server that generates and transmits a broadcast signal and/or broadcast associated information or a server that receives a previously generated broadcast signal and/or broadcast associated information and transmits the same to a terminal. The broadcast signal may include a TV broadcast signal, a radio broadcast signal, a data broadcast signal, and the like. Also, the broadcast signal may further include a broadcast signal in a form that a TV or radio broadcast signal is combined with a data broadcast signal.

The broadcast signal may be encrypted by at least one of technical standards (or broadcasting methods, e.g., ISO, IEC, DVB, ATSC, etc.) for transmitting and receiving a digital broadcast signal. The broadcast receiving module 111 may receive the digital broadcast signal using a method suitable for a technical standard selected from those technical standards.

Examples of the broadcast associated information may include information associated with a broadcast channel, a broadcast program, a broadcast service provider, and the like. The broadcast associated information may be provided via a mobile communication network. In this instance, the broadcast associated information may be received by the mobile communication module 112.

The broadcast associated information may be implemented in various formats. For instance, broadcast associated information may include Electronic Program Guide (EPG) of Digital Multimedia Broadcasting (DMB), Electronic Service Guide (ESG) of Digital Video Broadcast-Handheld (DVB-H), and the like. The broadcast signal and/or the broadcast related information received through the broadcast receiving module 111 may be stored in the memory 160.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). The wireless signal may include various types of data depending on a voice call signal, a video call signal, or a text/multimedia message transmission/reception.

The wireless Internet module 113 refers to a module for wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), High Speed Uplink Packet Access (HSUPA), Long Term Evolution (LTE), LTE-advanced (LTE-A) and the like. The wireless Internet module 113 may transmit/receive data according to one or more of such wireless Internet technologies, and other Internet technologies as well.

When the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

Here, another mobile terminal (which may be configured similarly to mobile terminal 100) may be a wearable device, for example, a smart watch, a smart glass or a head mounted display (HMD), which can exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position (or current position) of the mobile terminal. As an example, the location information module 115 includes a Global Position System (GPS) module, a Wi-Fi module, or both. For example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module. If desired, the location information module 115 may alternatively or additionally function with any of the other modules of the wireless communication unit 110 to obtain data related to the position of the mobile terminal. The location information module 115 is a module used for acquiring the position (or the current position) and may not be limited to a module for directly calculating or acquiring the position of the mobile terminal.

Examples of such inputs include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. Meanwhile, the cameras 121 may be arranged in a matrix configuration to permit a plurality of images having various angles or focal points to be input to the mobile terminal 100. Also, the cameras 121 may be located in a stereoscopic arrangement to acquire left and right images for implementing a stereoscopic image.

The microphone 122 processes an external audio signal into electric audio (sound) data. The processed audio data can be processed in various manners according to a function being executed in the mobile terminal 100. If desired, the microphone 122 may include assorted noise removing algorithms to remove unwanted noise generated in the course of receiving the external audio signal.

The user input unit 123 is a component that permits input by a user. Such user input may enable the controller 180 to control operation of the mobile terminal 100. The user input unit 123 may include one or more of a mechanical input element (for example, a mechanical key, a button located on a front and/or rear surface or a side surface of the mobile terminal 100, a dome switch, a jog wheel, a jog switch, and the like), or a touch-sensitive input element, among others. As one example, the touch-sensitive input element may be a virtual key, a soft key or a visual key, which is displayed on a touch screen through software processing, or a touch key which is located on the mobile terminal at a location that is other than the touch screen. Further, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like, and generate a corresponding sensing signal. The controller 180 generally cooperates with the sending unit 140 to control operations of the mobile terminal 100 or execute data processing, a function or an operation associated with an application program installed in the mobile terminal based on the sensing signal. The sensing unit 140 may be implemented using any of a variety of sensors, some of which will now be described in more detail.

The proximity sensor 141 refers to a sensor to sense presence or absence of an object approaching a surface, or an object located near a surface, by using an electromagnetic field, infrared rays, or the like without a mechanical contact. The proximity sensor 141 may be arranged at an inner area of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this instance, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data (or information) according to whether a touch with respect to a point on the touch screen is either a proximity touch or a contact touch.

A touch sensor senses a touch (or a touch input) applied to the touch screen (or the display unit 151) using any of a variety of touch methods. Examples of such touch methods include a resistive type, a capacitive type, an infrared type, and a magnetic field type, among others. As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 can sense which area of the display unit 151 has been touched. Here, the touch controller may be a component separate from the controller 180, the controller 180, and combinations thereof.

In addition, the controller 180 can execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches include a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize location information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121, which has been depicted as a component of the input unit 120, typically includes at least one a camera sensor (CCD, CMOS etc.), a photo sensor (or image sensors), and a laser sensor. Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors (TRs) at rows and columns to scan content received at the photo sensor using an electrical signal which changes according to the quantity of applied light. Namely, the photo sensor may calculate the coordinates of the physical object according to variation of light to thus obtain location information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

Also, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 may receive audio data from the wireless communication unit 110 or output audio data stored in the memory 170 during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceives, or otherwise experiences. A typical example of a tactile effect generated by the haptic module 153 is vibration. The strength, pattern and the like of the vibration generated by the haptic module 153 may be controlled by user selection or setting by the controller 180. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented so the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal therethrough. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a flash memory type, a hard disk type, a solid state disk (SSD) type, a silicon disk drive (SDD) type, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 can typically control operations relating to application programs and the general operations of the mobile terminal 100. For example, the controller 180 can set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provides internal power and supply the appropriate power required for operating respective elements and components included in the wearable device 100 under the control of the controller 180. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance. Various embodiments described herein may be implemented in a computer-readable medium, a machine-readable medium, or similar medium using, for example, software, hardware, or any combination thereof.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display module 151 may include at least one of a liquid crystal display (LCD), a thin film transistor-LCD (TFT LCD), an organic light-emitting diode (OLED), a flexible display, a three-dimensional (3D) display and an e-ink display. The display unit 151 may be implemented using two display devices, according to the configuration type thereof. For instance, a plurality of the display units 151 may be arranged on one side, either spaced apart from each other, or these devices may be integrated, or these devices may be arranged on different surfaces.

The display unit 151 may include a touch sensor that senses a touch with respect to the display unit 151 so as to receive a control command in a touch manner. Accordingly, when a touch is applied to the display unit 151, the touch sensor may sense the touch, and a controller 180 may generate a control command corresponding to the touch. Contents input in the touch manner may be characters, numbers, instructions in various modes, or a menu item that can be specified.

The microphone 122 may be configured to receive the user's voice, other sounds, and the like. The microphone 122 may be provided at a plurality of places, and configured to receive stereo sounds.

The interface unit 160 may serve as a path allowing the mobile terminal 100 to interface with external devices. For example, the interface unit 160 may be at least one of a connection terminal for connecting to another device (for example, an earphone, an external speaker, or the like), a port for near field communication (for example, an Infrared DaAssociation (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

At least one antenna for wireless communication may be disposed on the terminal body. The antenna may be embedded in the terminal body or formed in the case. For example, an antenna which configures a part of the broadcast receiving module 111 (see FIG. 1) may be retractable into the terminal body. Alternatively, an antenna may be formed in a form of film to be attached onto an inner surface of the housing or a case including a conductive material may serve as an antenna.

The terminal body is provided with a power supply unit 190 (see FIG. 1) for supplying power to the mobile terminal 100. The power supply unit 190 may include a batter 191 which is mounted in the terminal body or detachably coupled to an outside of the terminal body.

The battery 191 may receive power via a power cable connected to the interface unit 160. Also, the battery 191 may be (re)chargeable in a wireless manner using a wireless charger. The wireless charging may be implemented by magnetic induction or electromagnetic resonance.

An accessory for protecting an appearance or assisting or extending the functions of the mobile terminal 100 may further be provided on the mobile terminal 100. As one example of the accessory, a cover or pouch for covering or accommodating at least one surface of the mobile terminal 100 may be provided. The cover or pouch may cooperate with the display unit 151 to extend the function of the mobile terminal 100. Another example of the accessory may be a touch pen for assisting or extending a touch input onto a touch screen.

Figure 2A:
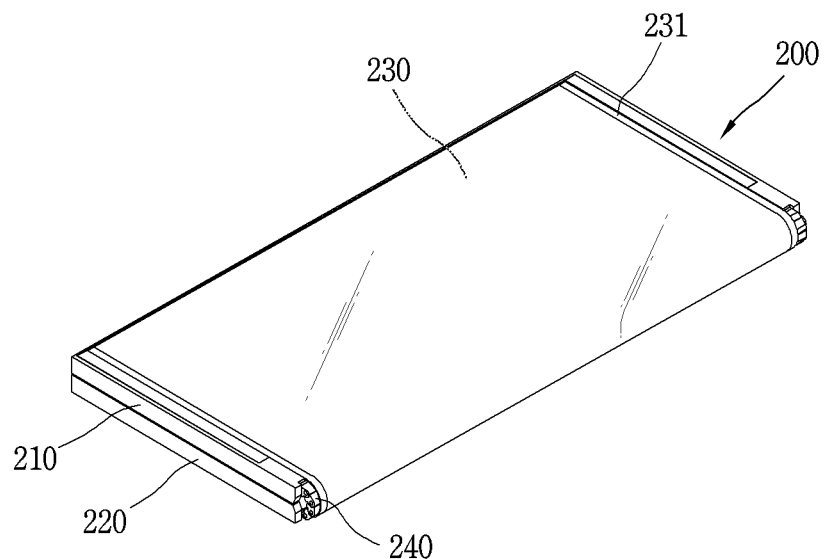
FIG. 2A is a perspective view of a flexible display device, which shows an outer folding state.
Figure 2B:
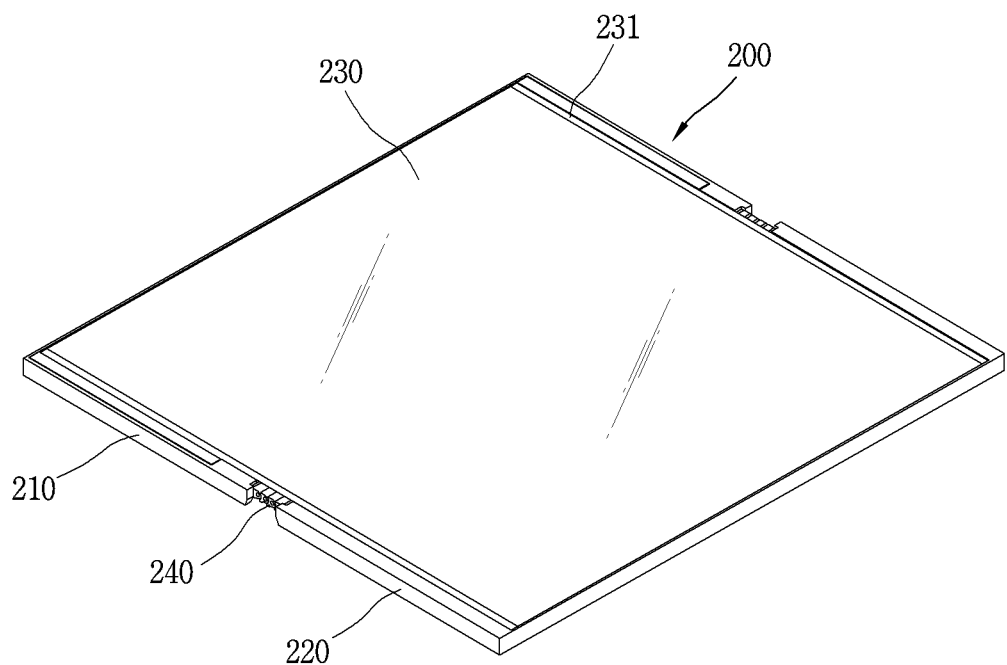
FIG. 2B is a perspective view of the flexible display device, which shows an unfolding state.

Next, FIG. 2A is a perspective view of a flexible display device, which shows an outer folding state, and FIG. 2B is a perspective view of the flexible display device, which shows an unfolding state. The flexible display device 200 may be understood as a type of the aforementioned mobile terminal, and the device may be referred to as a flexible display device for convenience in this specification.

As shown, the flexible display device 200 includes a flexible display unit 230 which is formed to be transformable by an external force. In addition, a rear plate 231 is coupled to a rear surface of the flexible display unit 230. Accordingly, the flexible display unit 230 can be transformable smoothly.

Here, the transformation includes at least one of curve, bending, folding, twist and rolling of a display module. Such a transformable display module can be referred to as 'flexible display'. Here, the flexible display unit 230 may include a general flexible display, e-paper and a combination thereof.

A general flexible display indicates a display having characteristics of the conventional flat display, manufactured on a thin and flexible substrate which can be curved, bent, folded, twisted and rolled like paper, and thus having a light and strong characteristic. Further, electronic paper is a display technology using a general ink characteristic, which may be different from the conventional flat display in that reflected light is used. The electronic paper can change information by using twist balls, or by using an electrophoresis using capsules.

Further, the flexible display device 200 can have a state that the flexible display unit 230 is transformed by an external force (e.g., a folded state having a finite curvature radius, hereinafter, will be referred to as first state, refer to FIG. 2A), and a state that the flexible display unit 230 is not transformed (e.g., a state having an infinite curvature radius, hereinafter, will be referred to as second state, refer to FIG. 2B). In the second state, a display region of the flexible display unit 230 is planar.

As shown, information displayed in the first state may include visual information output on a curved surface. Such visual information is implemented as light-emitting of sub pixels arranged in the form of matrices is controlled independently. The sub pixels mean a minimum unit to implement a single color.

The flexible display unit 230 has a curved state, not a flat state in the first state (e.g., a curved state up and down or right and left, a folded state). In this instance, if an external force is applied to the flexible display unit 230, the flexible display unit 230 can be transformed to a flat state (or a less curved state) or a more curved state.

The flexible display unit 230 can include a flexible touch screen by combining with a touch sensor. When a touch input is applied to the flexible touch screen, the controller 180 can perform a control corresponding to the touch input. The flexible touch screen can be configured to sense a touch input not only in the first state, but also in the second state.

In addition, the flexible display device 200 according to a modification of the present disclosure can be provided with a transformation sensing mechanism for sensing a transformation of the flexible display unit 230. The transformation sensing mechanism may be included in the sensing unit 140.

The transformation sensing mechanism be provided at the flexible display unit 230 or bodies 210, 220, thereby sensing information related to a transformation of the flexible display unit 230. The information related to a transformation may be a transformation direction, a transformation degree, a transformation position, a transformation time of the flexible display unit 230, and an acceleration to restore the transformed flexible display unit 230. Also, the information may be various information which can be sensed due to bending of the flexible display unit 230.

The controller 180 can change information displayed on the flexible display unit 230, or generate a control signal for controlling a function of the flexible display device 200, based on the information related to a transformation of the flexible display unit 230 sensed by the transformation sensing means.

In addition, a state transformation of the flexible display unit 230 is not limited to a transformation by an external force. For instance, when the flexible display unit 230 is in the first state, the first state can be changed into the second state by a command of a user or an application.

Also, the flexible display device 200 according to an embodiment of the present disclosure may be provided with a case (for instance, a frame, a cover, etc.) for forming appearance. The case may include the first body 210 and the second body 220, and various types of electronic components may be arranged in the first body 210 and the second body 220. The flexible display device 200 may be provided on one surface of each of the first and second bodies 210, 220 rotatably connected to each other, and be transformed by a movement of the first and second bodies 210, 220.

As shown in FIG. 2A, the flexible display unit 230 can be formed to be folded together with a movement of the second body 220 in the first state. In more detail, the flexible display unit 230 can be folded to cover an upper surface of the first body 210 together with the second body 220 in an outwardly-exposed state, and a rear surface of the first body 210 can be overlapped with the second body 220.

More specifically, the first body 210 of the flexible display device 200 supports one region of the flexible display unit 230, and the second body 220 of the flexible display device 200 supports another region (the remaining region) of the flexible display unit 230. Here, a plurality of electronic components for driving the flexible display device 200 may be mounted to at least one of the first and second bodies 210, 220. That is, the first and second bodies 210, 220 can perform a relative rotation in a connected state to each other, with a predetermined angle. Also, the flexible display unit 230 can be in a folded state (first state) to overlap at least one region thereof, by being bent.

As shown in FIG. 2B, the flexible display device 200 can have an unfolding state (second state) in which the flexible display unit 230 is unfolded. In this instance, the first and second bodies 210, 220 are arranged on the same plane in parallel, and the flexible display unit 230 is in an unfolded state by the first and second bodies 210, 220. Accordingly, a user can perform various tasks such as an electronic book and a web surfing more conveniently, by utilizing a large screen.

Figure 3A:
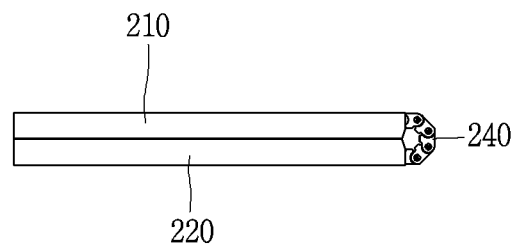
FIGS. 3A and 3B are conceptual views showing implementable states of the flexible display device.
Figure 3B:
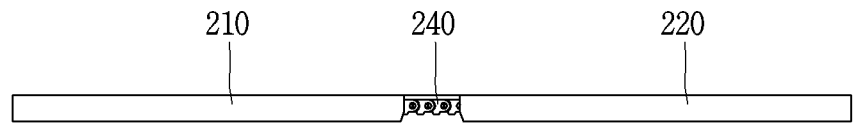

Next, FIGS. 3A and 3B are conceptual views showing implementable states of the flexible display device 200. As shown, the flexible display device 200 can implement the first state in which rear surfaces of the first and second bodies 210, 220 face each other, by folding. In this instance, the flexible display unit 230 is arranged outside the bodies so that an outer surface of the flexible display unit 230 is exposed to the outside. Thus, the mobile terminal can implement a flexible display device of an outer folding structure. Under the outer folding structure, the flexible display unit 230 is exposed to the outside at the time of a folding operation, and covers an outer surface of the first body 210 together with the second body 220.

Further, the flexible display device 200 can have an unfolding state (second state) in which the flexible display unit 230 is unfolded. In this instance, the first and second bodies 210, 220 are arranged on the same plane in parallel.

While the first state is changed into the second state, an angle formed by one region and another region of the flexible display unit 230 is variable. Thus, the flexible display unit 230 can be gradually folded by interworking with the angle variation. This allows the first state to be converted into the second state.

In the first state, the first and second bodies 210, 220 are overlapped with each other, and a space between one region and another region of the flexible display unit 230 is bent with a curved surface. In this instance, the curved surface may be implemented by a hinge unit 240.

As shown in FIG. 3A, since the second body 220 is folded to the flexible display unit 230 with respect to the first body 210, the hinge unit 240 is configured to enclose one side surface of the first body 210 at the time of a folding operation. Here, one side surface of the first body 210 may have a thickness greater than that of the second body 220, and the first body 210 encloses one side surface of the second body 220 together with the flexible display unit 230. As a result, an outer folding can be implemented.

In addition, the rear plate 231 can be coupled to the rear surface of the flexible display unit 230. Also, the rear plate 231 can implement the first state shown in FIG. 3A and the second state shown in FIG. 3B by being transformed together with the flexible display unit 230.

Further, the flexible display device 200 can implement an outer folding structure as the rear plate 231 is transformed together with the flexible display unit 230. Under the outer folding structure, the flexible display unit 230 is in an outward-exposed state at the time of a folding operation, and covers an outer surface of the first body 210 together with the second body 220.

As shown in FIG. 3A, the flexible display device 200 can implement the first state in which the rear surfaces of the first and second bodies 210, 220 face each other, as one side of the flexible display unit 230 is folded together with the rear plate 231. Here, the outer side surface of the flexible display unit 230 maintains an outwardly-exposed state, and is arranged outside each of the first and second bodies 210, 220.

As shown in FIG. 3B, the flexible display device 200 can have an unfolding state (second state) in which the flexible display unit 230 is unfolded. In the second state, the first and second bodies 210, 220 are arranged on the same plane in parallel. Also, while the first state of the flexible display device 200 is changed into the second state, an angle formed by one region and another region of the flexible display unit 230 is variable. This can be implemented by a transformation of the rear plate 231.

Figure 9:
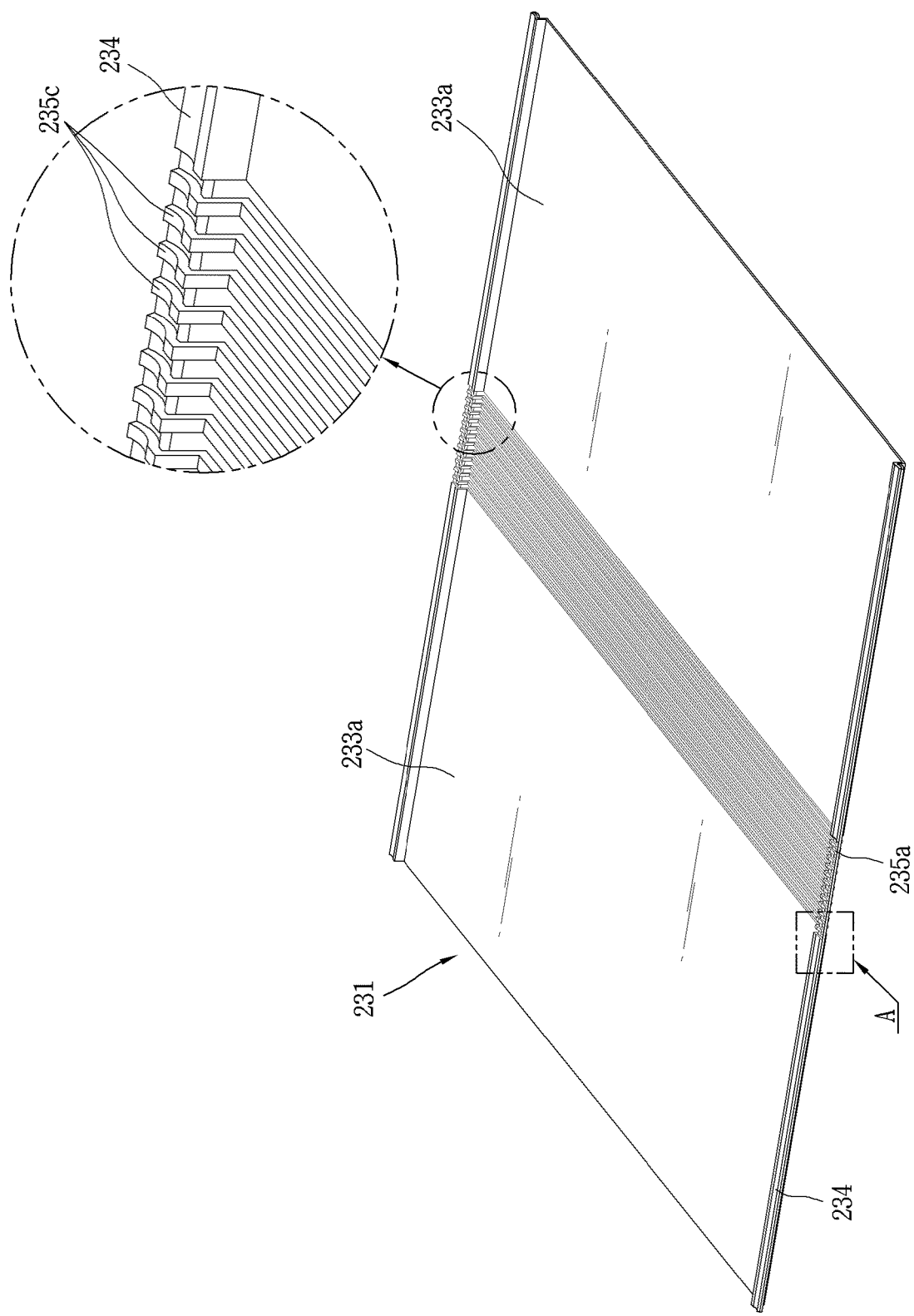
FIG. 9 is a perspective view of a rear plate.

In particular, the rear plate 231 can be folded by a transformation of a transformation portion 235a (FIG. 9). Also, a region of the flexible display unit 230, corresponding to the transformation portion 235a is gradually folded as an angle of the transformation portion 235a of the rear plate 231 is changed. This allows the first state to be converted into the second state.

As shown in FIGS. 3A and 3B, the flexible display device 200 can implement the first state in which the flexible display unit 230 is folded, and the second state in which the flexible display unit 230 is unfolded. Accordingly, a user can utilize a mobile terminal which is used at ordinary times, as a note or a tablet more conveniently.

That is, the flexible display device 200 according to the present disclosure can implement the flexible display unit 230 having two screen sizes of a folding state and an unfolding state, and can provide a user with two modes of a phone and a note or a tablet. Further, through an interworking structure of the bodies 210, 220, a connection operation of a folding state and an unfolding state can be implemented in a compact space.

Figure 4:
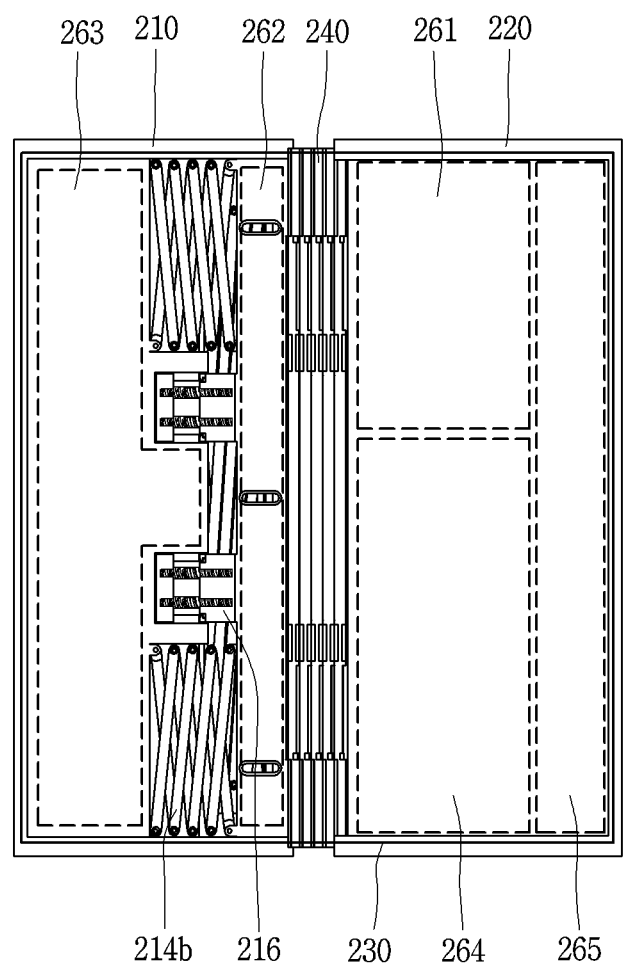
FIG. 4 is a planar view showing an inner form of the flexible display device.
Figure 5:
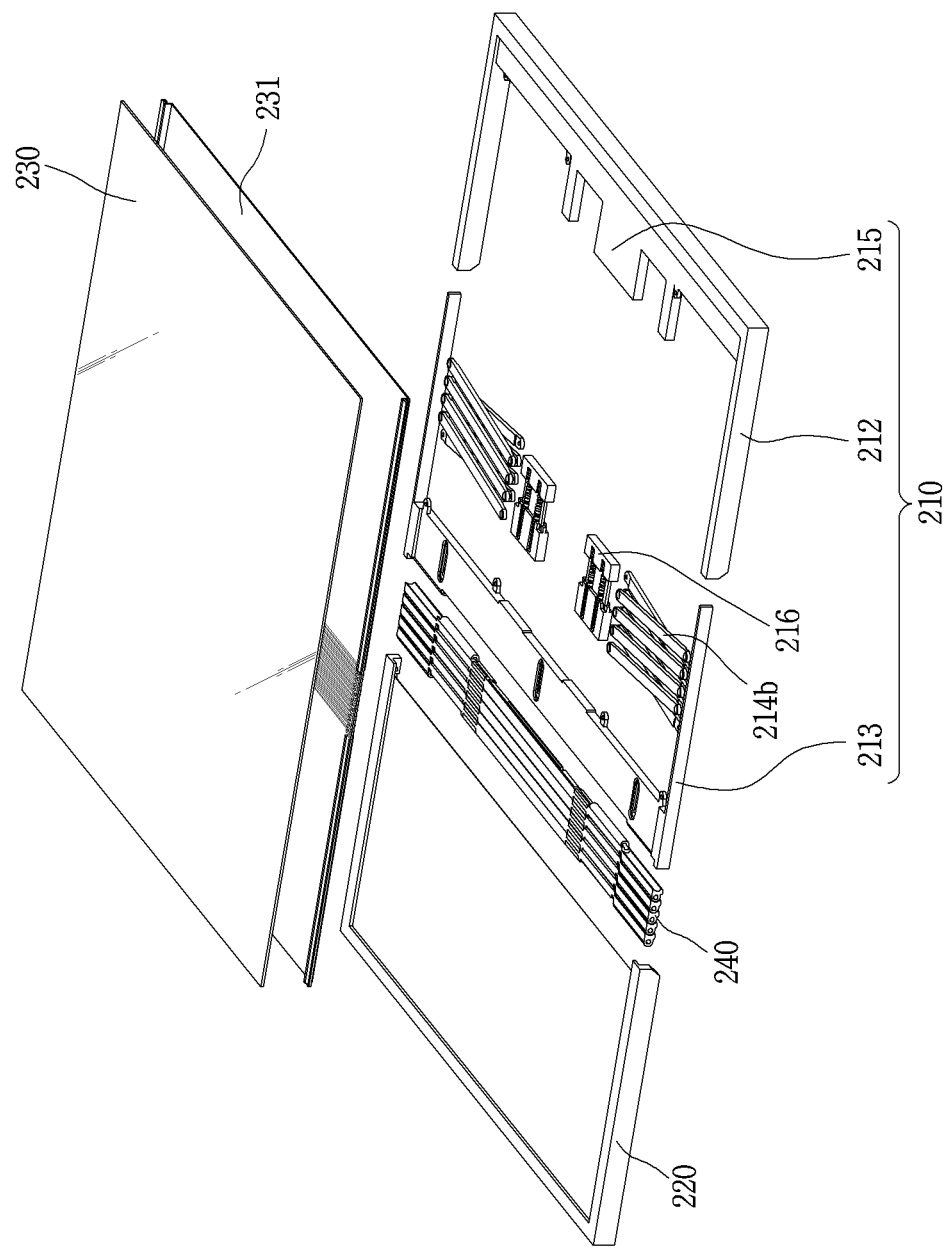
FIG. 5 is a disassembled perspective view of the flexible display device.

Next, FIG. 4 is a planar view showing an inner form of the flexible display device 200 having the flexible display unit 230 removed therefrom, and FIG. 5 is a disassembled perspective view of the flexible display device 200. As shown, the flexible display device 200 includes the first body 210, the second body 220, the flexible display unit 230 and the hinge unit 240. Under such a structure, the flexible display unit 230 can implement a first state (folding) and a second state (unfolding).

Also, the flexible display unit 230 can implement the first state (folding) and the second state (unfolding) by movement of the first body 210 and the second body 220, by being coupled to the rear plate 231. Further, the rear plate 231 can be coupled to a rear surface of the flexible display unit 230. In more detail, the rear plate 231 serves to support the flexible display unit 230, and can be transformed together with the flexible display unit 230 as the flexible display device 200 implements folding (the first state) and unfolding (the second state). A detailed structure of the rear plate 231 will be explained later.

As shown in FIG. 5, the first body 210 can be provided with a plurality of parts connected to each other so as to be relatively moveable with respect to each other. For example, the first body 210 can include a first part 212 and a second part 213. The first part 212 is a part which can be held by a user's hand, and forms an appearance of a rear surface of the first body 210.

Also, the first part 212 can be formed to have a '⊏' shape. In addition, a fixing portion 215 can be formed at one side of the first part 212. In particular, the fixing portion 215 is formed to fix one side of links 214b to be explained later. Also, in the first part 212, the links 214b can be installed and formed to be extended and contracted according to whether or not the flexible display unit 230 is extended.

Further, the second part 213 is formed to have a '⊏' E shape, and can be installed to face the first part 212. The hinge unit 240 can be coupled to one side of the second part 213, and the second part 213 can be rotatably coupled to the second body 220. In addition, the second part 213 can be installed so as to be slidable between itself and the first part 212. For example, both sides of the second part 213, extended towards the first part 212, can be slidable by being supported at both sides of the first part 212.

Thus, the second part 213 performs a sliding operation by a predetermined distance between itself and the first part 212, thereby compensating for a length change due to folding or unfolding of the flexible display unit 230. Further, the plurality of parts of the first body 210 may further include a plurality of links 214b installed between the first part 212 and the second part 213 and rotatably connected to each other, and an elastic member 216 formed to be extended or contracted in correspondence to a movement of the plurality of links 214b.

A relative movement of the first part 212 and the second part 213 can be implemented as the first part 212 and the second part 213 are arranged with the plurality of links 214b rotatably connected to each other and the elastic member 216 are interposed therebetween.

Further, the second body 220 has a structure to be connected to the first body 210 so as to be relatively rotatable through the hinge unit 240, thereby implementing a folding state of the flexible display device 200. Also, the flexible display unit 230 coupled to the rear plate 231 is coupled to one surface of the second body 220, and a user can grasp (hold) the second body 220 for folding or unfolding.

When the flexible display unit 230 is in a folding state (the first state), the second body 220 is arranged to cover the rear surface of the first body 210. In this instance, the flexible display unit 230 is exposed to the outside.

Further, the hinge unit 240 for connecting the first body 210 and the second body 220 to each other so as to be relatively rotatable is arranged at one side of the first body 210. As the hinge unit 240 is operated, the second body 220 can be folded to be overlapped with the first body 210. Also, the flexible display unit 230 is coupled to one surface of the second body 220, and a user can grasp (hold) the second body 220 for folding or unfolding.

When the flexible display unit 230 is in a folding state (the first state), the second body 220 is arranged to cover the rear surface of the first body 210. In this instance, the flexible display unit 230 is exposed to the outside. Also, the hinge unit 240 for connecting the first body 210 and the second body 220 to each other so as to be relatively rotatable is arranged at one side of the first body 210. As the hinge unit 240 is operated, the second body 220 can be folded to be overlapped with the first body 210.

The hinge unit 240 is provided with a plurality of hinge segments 241 sequentially arranged in one direction (FIGS. 7A and 8A), and each of the hinge segments 241 is arranged to enclose the side surface of the first body 210 in a folding state of the flexible display unit 230. Further, the flexible display unit 230 is formed to have a flexible characteristic for folding. Also, the flexible display unit 230 is arranged on the front surface of the first body 210 and the second body 220, and can be transformed in correspondence to folding and unfolding of the first body 210 and the second body 220.

As shown in FIG. 4, a main PCB 261 for processing a signal for driving of the flexible display device 200, a battery 264 for power supply, and a driver IC for operating the flexible display unit 230 can be positioned so as to be overlapped with the second body. Further, a hardware component 263 having various types of sensors and a camera module can be positioned so as to be overlapped with a first fixing housing, and a sub PCB 262 can be positioned so as to be overlapped with the second part 213.

Figure 6:
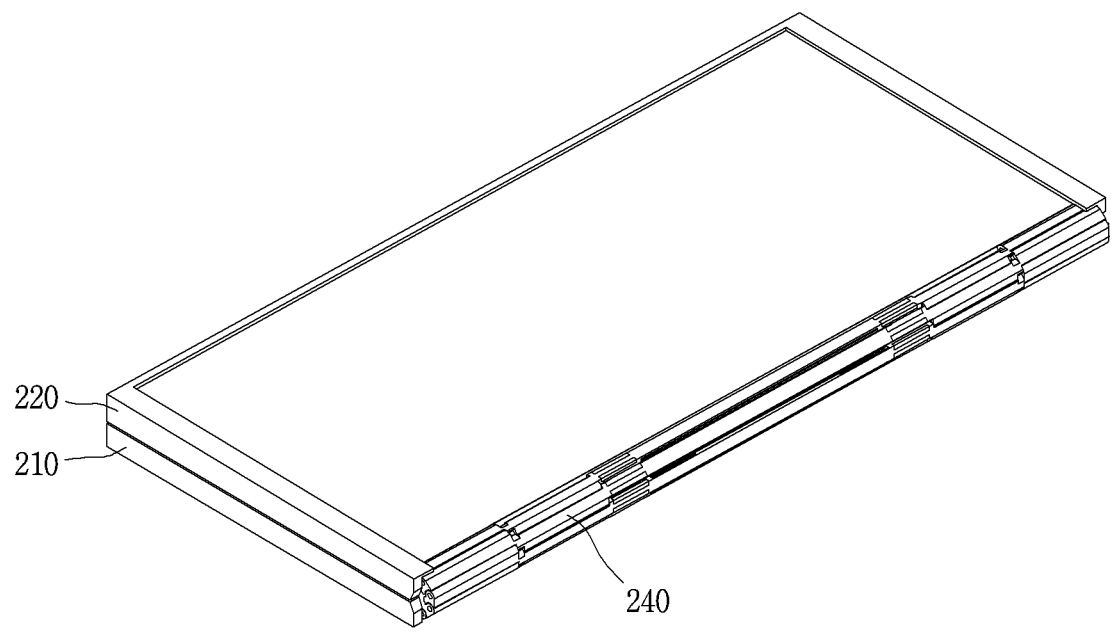
FIG. 6 is a perspective view showing a first state of the flexible display device.
Figure 7A:
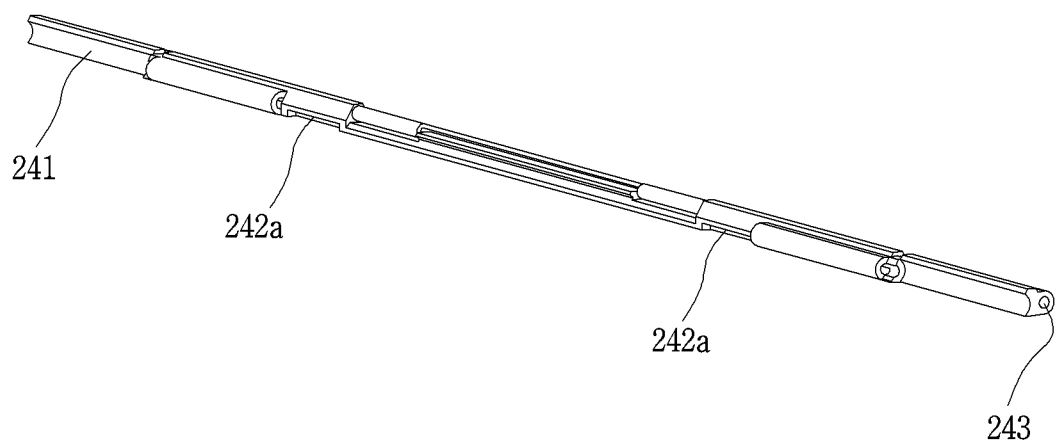
FIGS. 7A and 7B are perspective views showing a front surface and a rear surface of hinge segments of a hinge unit.
Figure 7B:
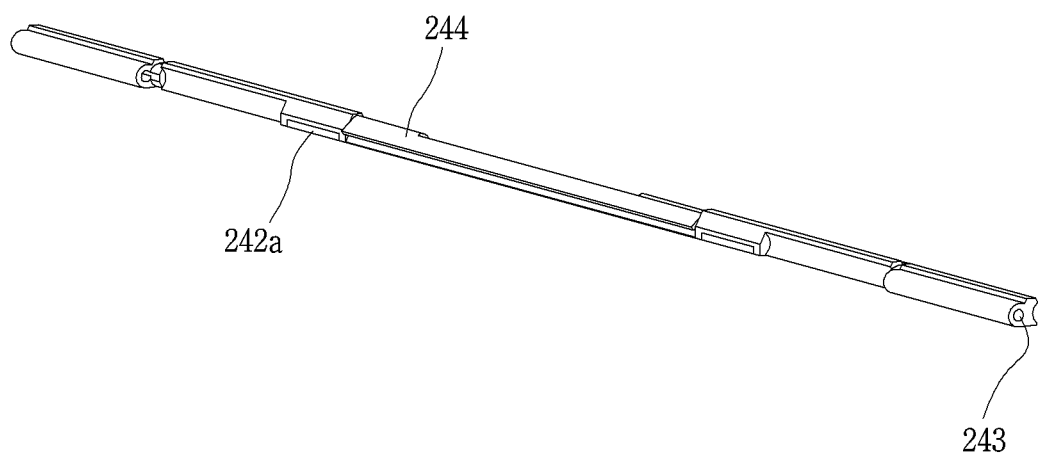
Figure 8A:
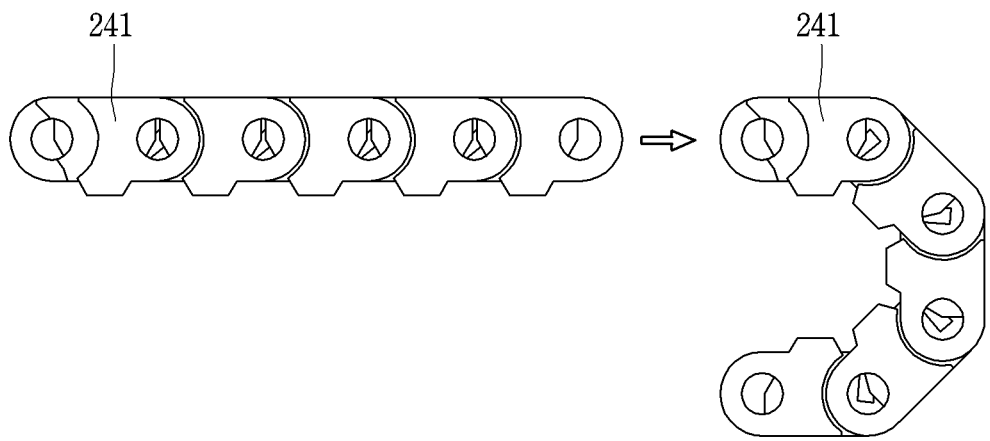
FIGS. 8A-8C are conceptual views showing the hinge unit.
Figure 8B:
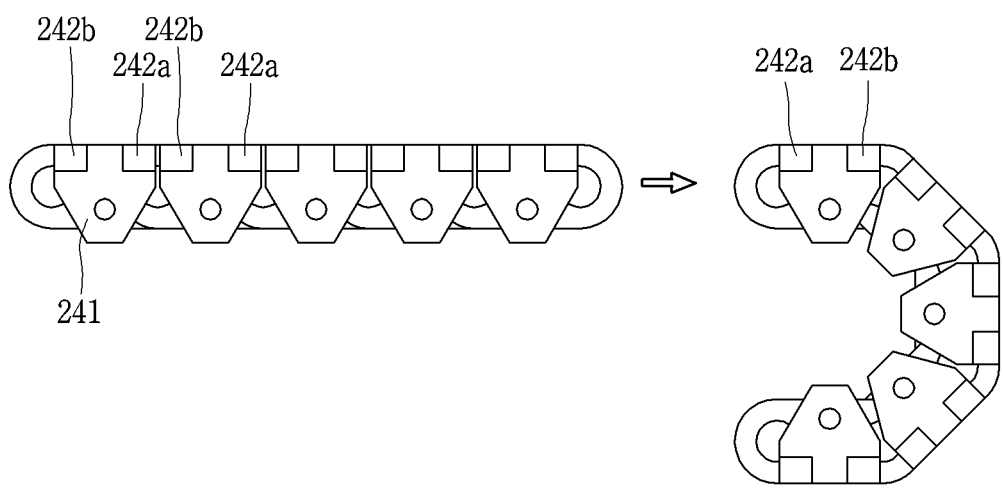
Figure 8C:
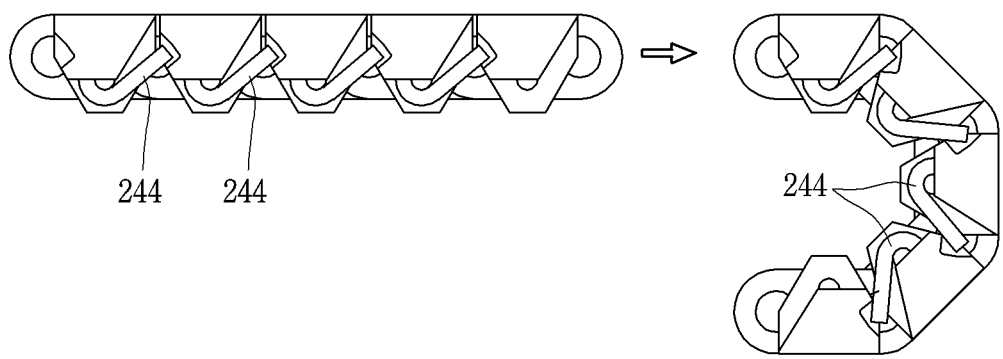

Next, FIG. 6 is a perspective view showing a first state of the flexible display device 200, FIGS. 7A and 7B are perspective views showing a front surface and a rear surface of hinge segments 241 of the hinge unit 240, and FIGS. 8A-8C are conceptual views showing various embodiments of the hinge unit 240 for folding of the flexible display unit 230 of the flexible display device 200.

The hinge unit 240 connects the first and second bodies 210, 220 to each other so as to be relatively rotatable with respect to each other, and is arranged between the first and second bodies 210, 220. Thus, the first and second bodies 210, 220 are connected to each other by the hinge unit 240 so as to be relatively rotatable with respect to each other.

Since one side surface of the first body 210 has a thickness greater than that of the second body 220, the hinge unit 240 encloses the one side surface of the first body 210 at the time of folding. Further, the hinge unit 240 includes a plurality of hinge segments 241 sequentially arranged in one direction.

Also, the hinge segments 241 are arranged to enclose one side surface of the first body 210 in a folding state of the flexible display unit 230. The hinge segment 241 is arranged between the first and second bodies 210, 220.

As shown in FIG. 8, in the first state, the hinge segments 241 are arranged along a curved surface of the first body 210, and each hinge segment 241 is rotatably connected to its neighboring hinge segment 241 for folding. The hinge segment 241 can be formed so that an interval of at least part of its neighboring hinge segment 241 is changed by folding and unfolding of the flexible display unit 230.

As shown in FIGS. 7A and 8B, first magnets 242a having a magnetism may be installed at one side of each hinge segment 241, so that the hinge segments 241 arranged to be adjacent to each other can have a rotation displacement. The first magnets 242a can be installed at a plurality of positions of each hinge segment 241. As shown in FIG. 8B, second magnets 242b having a different magnetism from the first magnets 242a can be installed at another side of each hinge segment 241.

As shown in FIGS. 8A-8C, when the flexible display device 200 is in an unfolding state in which the first body 210 and the second body 220 are arranged in parallel, the first magnets 242a and the second magnets 242b of each hinge segment 241 are closely-attached to each other between the hinge segments 241 arranged to be adjacent to each other. Accordingly, the unfolding state can be maintained.

When the flexible display device 200 has a bent shape, each of the hinge segments 241 is arranged to face the rear surface of the flexible display unit 230. Here, a folding state and an unfolding state can be maintained and a counter-bending of the hinge unit 240 can be prevented, through an elastic force of a torsion spring 244 installed at a central region of each of the hinge segments 241 arranged to be adjacent to each other (FIG. 8C). That is, each of the hinge segments 241 guides folding and unfolding of the second body 220, and a bent sectional shape thereof guides to have a predetermined curvature.

Figure 10A:
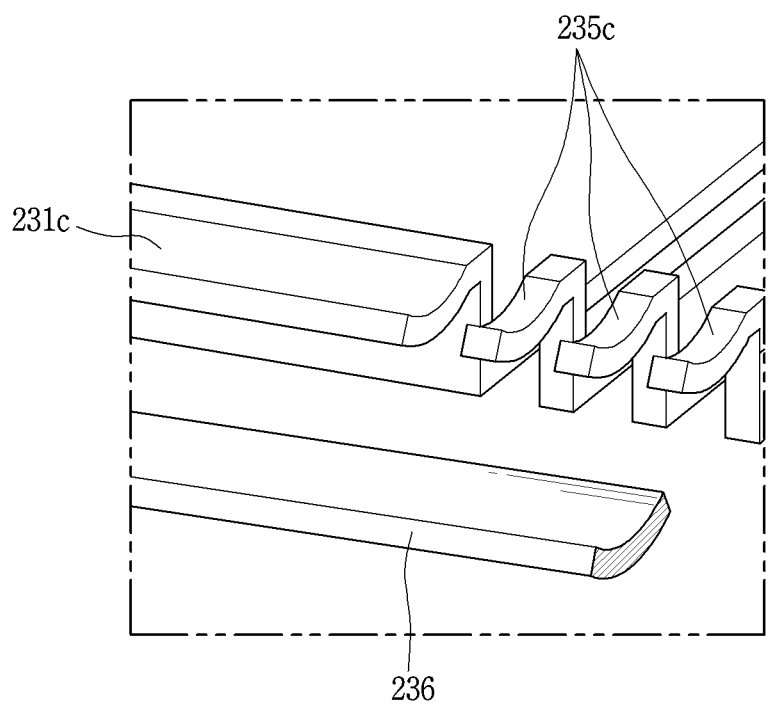
FIG. 10A is a partially enlarged view showing a metallic supporting member coupled to the rear plate.
Figure 10B:
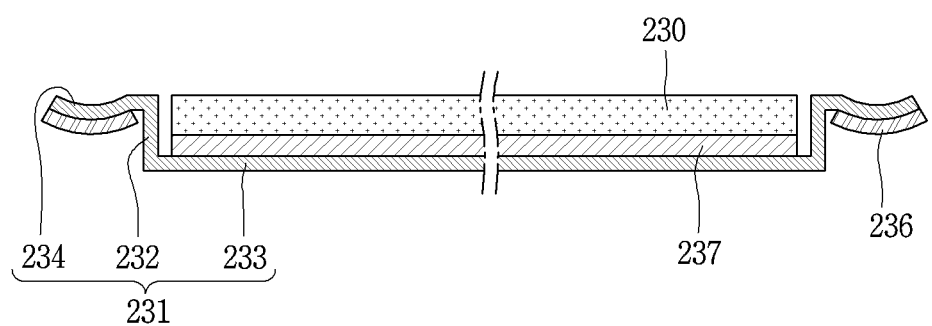
FIG. 10B is a sectional view showing a flexible display unit coupled to the rear plate.

Next, FIG. 9 is a perspective view showing the rear plate 231, FIG. 10A is a partially enlarged view showing a metallic supporting member coupled to the rear plate 231, and FIG. 10B is a sectional view showing the flexible display unit 230 coupled to the rear plate 231.

The rear plate 231 is coupled to the rear surface of the flexible display unit 230, and can be formed to be transformable together with the flexible display unit 230. In particular, the rear plate 231 can be formed to be folded or unfolded for the first and second states of the flexible display device 200 and may be formed of a stainless (STS) thin film.

Further, the rear plate 231 includes mounting portions 233a for coupling the rear surface of the flexible display unit 230, and transformation portions 235a which are transformable in correspondence to a movement of the flexible display unit 230. Also, the rear plate 231 includes a bending supporting portion 234 extended towards the outside from both sides of the mounting portions.

In addition, the mounting portion 233a for forming a bottom surface of the rear plate 231 can be formed in the shape of a thin plate which is extended in one direction, and can be concaved with a predetermined depth so as to mount the rear surface of the flexible display unit 230. Further, the rear plate 231 includes a bending supporting portion 234 extended towards the outside from both sides of the mounting portions 233a. The bending supporting portion 234 are bent concaved downward, and includes a bendable structure in one direction. For instance, the bending supporting portion 234 may be bent in a U-shape.

As shown in FIG. 10A, a metallic supporting member 236 can be coupled to a bottom surface of the bending supporting portion 234. In particular, the metallic supporting member 236 can be formed to have a shape corresponding to the bottom surface of the bending supporting portion 234. Also, the metallic supporting member 236 is extended in one direction along the bottom surface of the bending supporting portion 234 of the rear plate 231.

In addition, the metallic supporting member 236 can be formed to maintain a parallel state when the flexible display unit 230 is unfolded, and to maintain a bent state when the flexible display unit 230 is folded. Further, the metallic supporting member 236 can be formed of titanium (Ti) specially processed to maintain a bent state by transformation.

The transformation portions 235a serve to transform the flexible display unit 230. The transformation portion 235a can be formed to be transformable for implementation of folding or unfolding of the flexible display unit 230. In particular, the transformation portion 235a can be transformed so that the rear plate 231 is folded.

As shown in the enlarged part of FIG. 9, the transformation portions 235a can include a plurality of extension bars 235c which connect both sides of the bending supporting portion 234 arranged in parallel. When the flexible display unit 230 is folded, the plurality of extension bars 235c can be bent by forming a relative movement with the neighboring extension bars 235c, in correspondence to the movement of the flexible display unit 230. Accordingly, the rear plate 231 can be folded, and thus the flexible display unit 230 coupled to the rear plate 231 can be folded.

Alternatively, the transformation portion 235a can be formed by cutting a selected region of the rear plate 231 by predetermined intervals. In this instance, the same effect can be obtained as the plurality of extension bars 235c which connect the bending supporting portions 234 positioned at both sides of the mounting portions 233a. Further, the transformation portion 235a can be formed at a position corresponding to the hinge unit 240, and can be bent for implementation of the first state that the flexible display unit 230 is folded.

As shown in FIG. 10B, the flexible display unit 230 can be coupled to the mounting portions 233a by a bonding member 237. The bonding member 237 may be installed between the flexible display unit 230 and the mounting portions 233a of the rear plate 231.

The bonding member 237 serves to firmly couple a lower surface of the flexible display unit 230 to a bottom surface of the rear plate 231. In particular, the bonding member 237 can be formed of a flexible material so that a gap of the flexible display unit 230 is prevented, the gap occurring when there is a space between the rear plate 231 and the flexible display unit 230, as the rear plate 231 and the flexible display unit 230 are transformed.

Further, the bonding member 237 can restrict damage of the flexible display unit 230 by an external force, by preventing a stress occurring between the rear plate 231 and the flexible display unit 230. For instance, the bonding member 237 may include elastomer resin having an elastic force, by using synthetic epoxy resin, etc. Accordingly, the bonding member 237 firmly couples the flexible display unit 230 and the rear plate 231 to each other, and is smoothly transformed together with the rear plate 231 in correspondence to the flexible display unit 230 even if the flexible display unit 230 is transformed by folding and unfolding.

Further, the mounting portions 233a are concaved in a U-shape. The mounting portion 233a also include a horizontal portion 233 having a flat shape so as to be coupled to the rear surface of the flexible display unit 230, and a vertical portion 232 upward extended from both ends of the horizontal portion 233 so as to cross the horizontal portion 233.

In addition, the flexible display unit 230 can be coupled onto the horizontal portion 233 of the mounting portion 233a of the rear plate 231 by the bonding member 237. Here, the flexible display unit 230 can be formed to have the same height as the vertical portion 232. In this instance, since the flexible display unit 230 has the same height as the bending supporting portion 234, the appearance exposed to the outside can be enhanced.

Figure 11A:
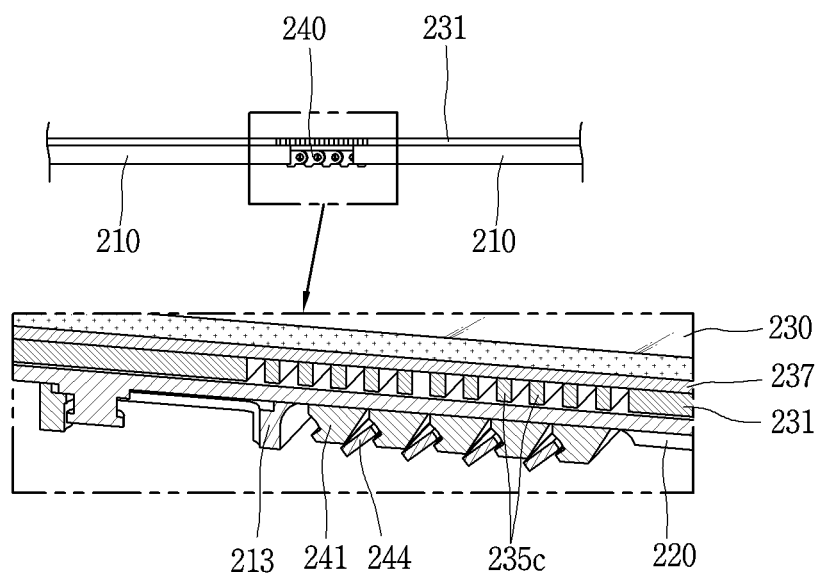
FIG. 11A is an enlarged sectional view showing an arrangement structure of the rear plate and the flexible display unit, in a second state where the flexible display unit has been unfolded.
Figure 11B:
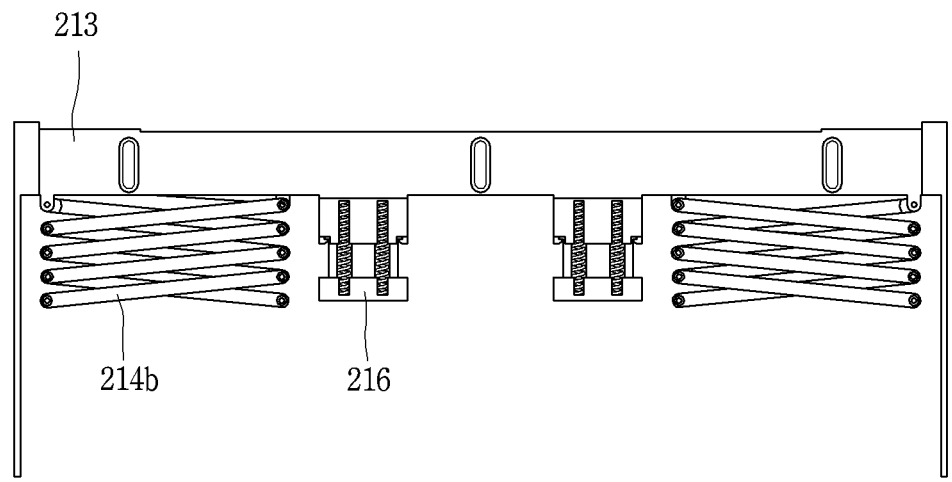
FIG. 11B is a conceptual view showing a second part in the second state.
Figure 12A:
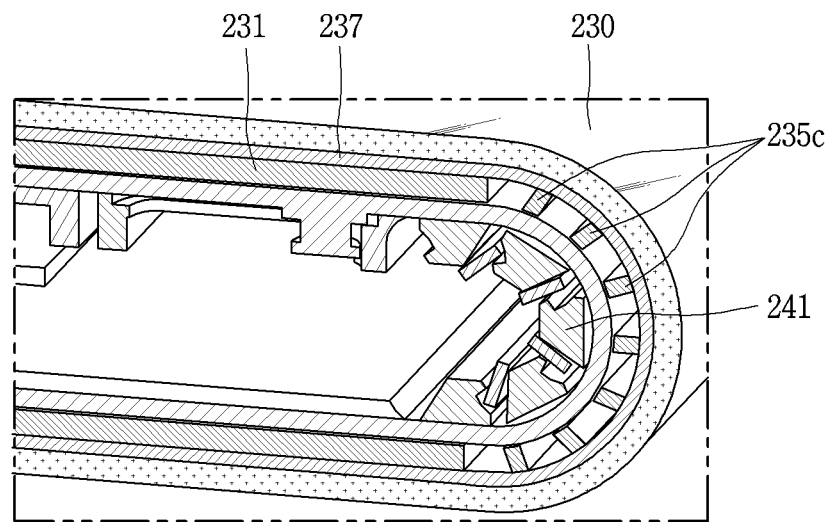
FIG. 12A is an enlarged sectional view showing an arrangement structure of the rear plate and the flexible display unit, in a first state where the flexible display device has been folded.
Figure 12B:
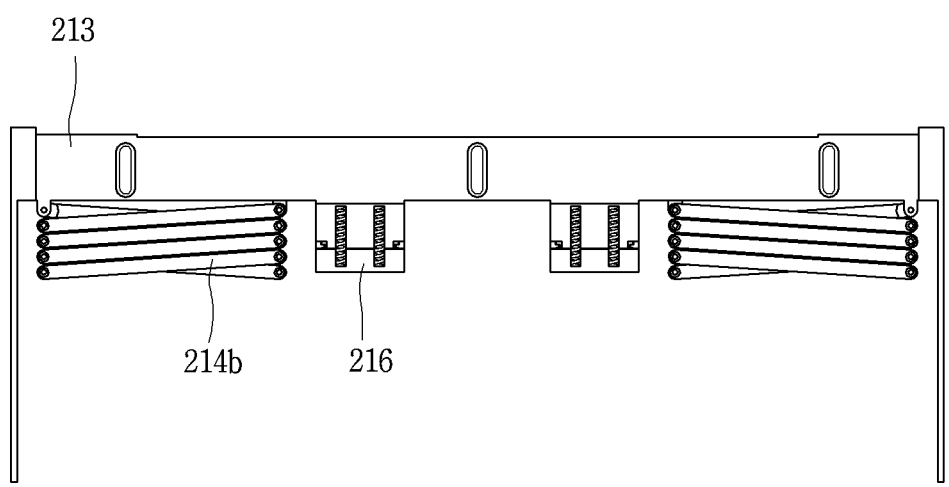
FIG. 12B is a conceptual view showing the second part in the first state where the flexible display device has been folded.

Next, FIG. 11A is an enlarged sectional view showing an arrangement structure of the rear plate 231 and the flexible display unit 230, in a second state where the flexible display unit 230 has been unfolded, and FIG. 11B is a conceptual view showing the second part 213 in the second state. Also, FIG. 12A is an enlarged sectional view showing an arrangement structure of the rear plate 231 and the flexible display unit 230, in a first state where the flexible display device 200 has been folded, and FIG. 12B is a conceptual view showing the second part 213 in the first state.

As aforementioned, the first and second bodies 210, 220 of the flexible display device 200 are connected to each other by the hinge unit 240 so as to be relatively rotatable with respect to each other. Here, the hinge unit 240 connects the first and second bodies 210, 220 to each other so as to be relatively rotatable with respect to each other, and are arranged between the first and second bodies 210, 220. The flexible display unit 230 is also arranged on one surface of the first and second bodies 210, 220, and can be folded and unfolded by the relative rotation.

Further, the hinge unit 240 includes a plurality of hinge segments 241 sequentially arranged in one direction, and each of the hinge segments 241 is arranged to enclose the side surface of the first body 210 in the first state that the flexible display unit 230 is folded. Here, the transformation portions 235a can be formed at a position corresponding to the hinge unit 240, and can be bent for implementation of the first state that the flexible display unit 230 is folded.

Further, the transformation portion 235a includes a plurality of extension bars 235c. The transformation portion 235a can also be transformed into a shape corresponding to folding of the hinge unit 240, in order to implement the first state in which the first and second bodies 210, 220 are overlapped with each other.

If the hinge unit 240 is folded for implementation of the first state of the flexible display device 200, the transformation portion 235a of the rear plate 231 are transformed in correspondence to folding of the hinge unit 240. More specifically, if the hinge unit 240 is folded, each extension bar 235c of the transformation portion 235a, arranged to be overlapped with the hinge unit 240 up and down has its position changed.

That is, if the hinge unit 240 is folded, a distance between the neighboring extension bars 235c of the transformation portion 235a is changed. Accordingly, the transformation portions 235a can be bent in correspondence to folding of the hinge unit 240.

When the hinge segments 241 of the hinge unit 240 are converted to a folding state from an unfolding state, a distance of one end becomes far from a rotation center of the hinge segments 241, and the flexible display unit 230 is arranged to cover the one end.

That is, as shown in FIG. 8, at the time of a folding operation, one upper end of the flexible display unit becomes far from the rotation center of the hinge segments 241, whereas another lower end of the flexible display unit becomes close to the rotation center. In this instance, the first and second bodies 210, 220 may perform a relative sliding in order to compensate for the distance change.

That is, when the flexible display unit 230 is folded, it is required to compensate for a length change due to a transformation of the hinge unit 240. Accordingly, the elastic member 216 of the first body 210 can be extended or contracted to compensate for the length change due to a transformation of the hinge unit 240.

As shown in FIG. 12B, if the flexible display unit 230 is folded together with the rear plate 231, the elastic member 216 installed at the first body 210 is extended or contracted to thus partially compensate for the length change due to a transformation of the hinge unit 240. Here, a region of the rear plate 231 is fixed to the second body 220. Accordingly, as the elastic member 216 installed for sliding of the second part 213 of the first body 210, and the links 214b installed at both sides of the elastic member 216 are extended and contracted, the length change due to a transformation of the hinge unit 240 can be compensated.

Further, since the elastic member 216 is installed at the second part 213, sliding of the second part 213 can be implemented. The second part 213 also has a structure to be slidable towards the first part 212, and one side of the second part 213 can be connected to one of the hinge segments 241.

Further, one end of the elastic member 216 can be connected to the second part 213, and another end thereof can be connected to the fixing portion 215 of the first part 212. In addition, the elastic member 216 provides an elastic force to the second part 213 by being compressed or extended, and to compensate for a distance due to bending of the hinge unit 240. Here, the elastic member 216 can provide an elastic force to the second part 213 in a direction which becomes far from the hinge unit 240.

As shown in FIGS. 11A and 11B, the elastic member 216 can provide a maximum elastic force in a lengthwise direction of the mobile terminal, if the hinge unit 240 and the second body 220 are spaced away from each other to the maximum. As shown in FIGS. 12A and 12B, if the hinge unit 240 and the second body 220 are close to each other to the maximum by folding of the second body 220, the elastic member 216 is in a closely-attached state to thus provide no elastic force.

Figure 13:
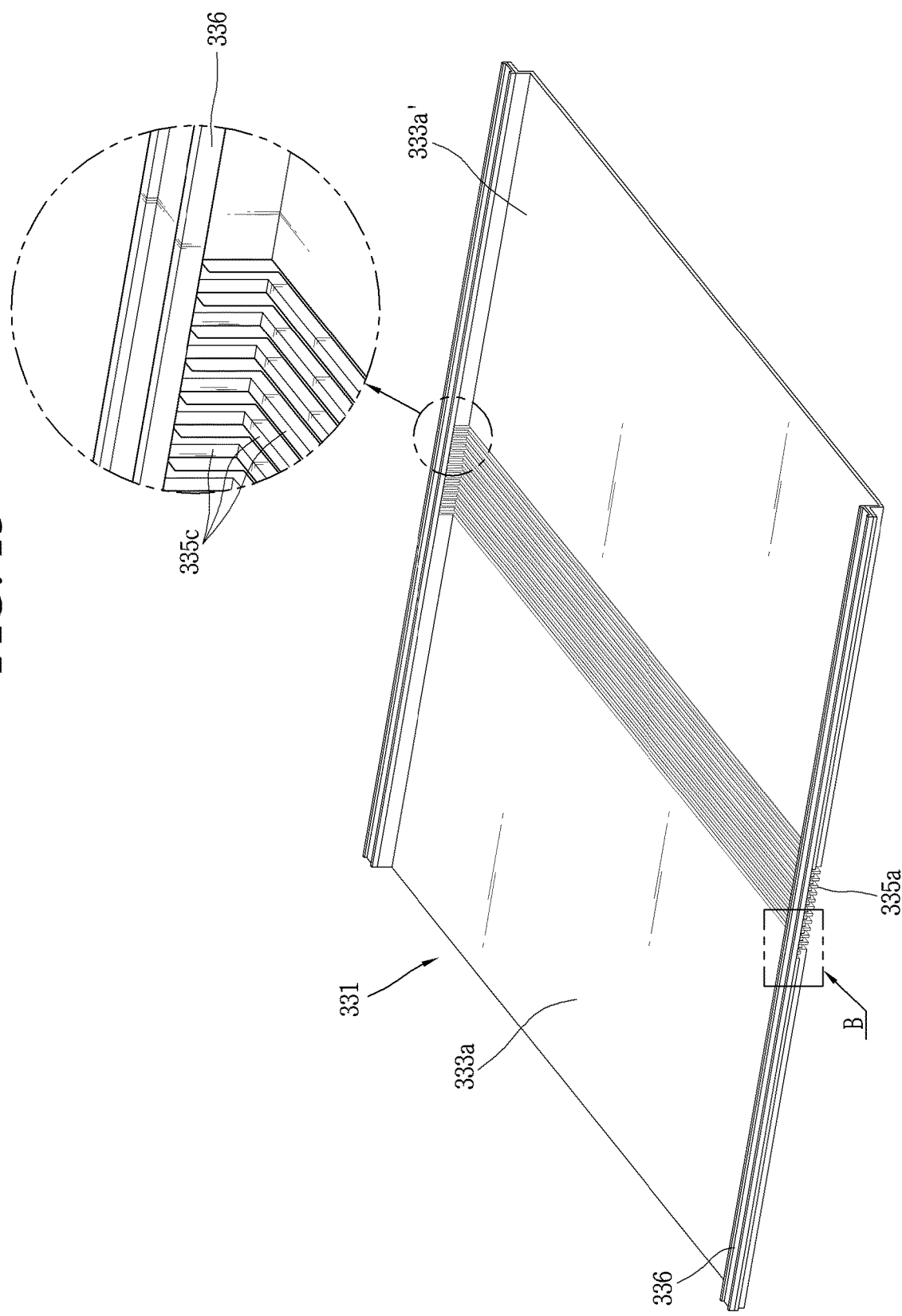
FIG. 13 is a perspective view showing a rear plate according to another embodiment of the present disclosure.
Figure 14A:
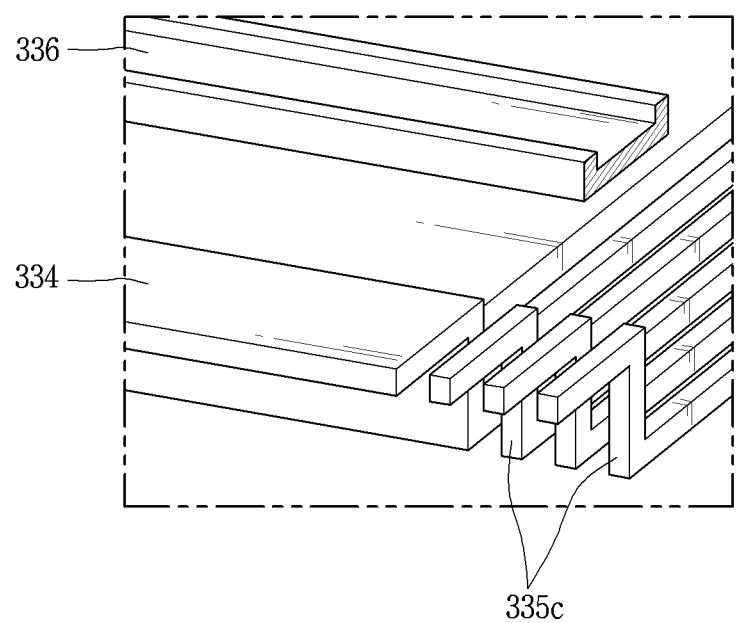
FIG. 14A is a partially enlarged view showing a molding member coupled to the rear plate.
Figure 14B:
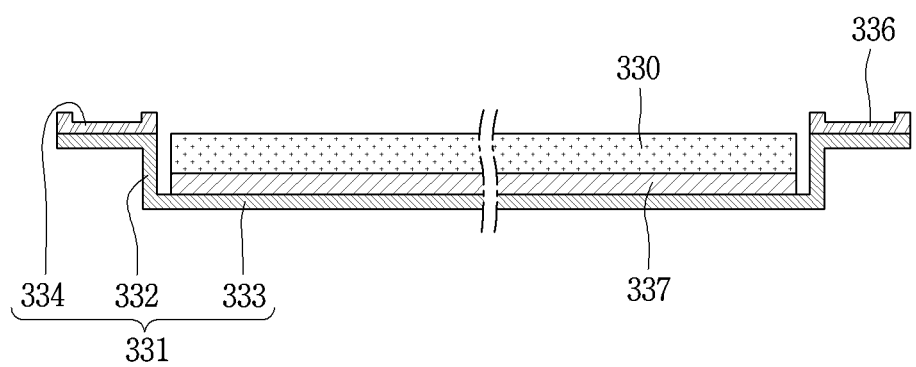
FIG. 14B is a sectional view showing a lamination structure of a flexible display unit coupled to the rear plate.

Next, FIG. 13 is a perspective view showing a rear plate 331 according to another embodiment of the present disclosure, FIG. 14A is a partially enlarged view showing a molding member 336 coupled to the rear plate 331, and FIG. 14B is a sectional view showing a lamination structure of a flexible display unit 330 coupled to the rear plate 331.

As shown, the rear plate 331 is coupled to a rear surface of the flexible display unit 330, and can be transformed together with the flexible display unit 330. Further, the rear plate 331 can be folded or unfolded for implementation of first and second states of a flexible display device 300. The rear plate 331 can also be formed of stainless (STS) thin film. In addition, the rear plate 331 includes mounting portions 333a, 333a' for coupling the rear surface of the flexible display unit 330, transformation portions 335a which are transformable in correspondence to a movement of the flexible display unit 330, and a bending supporting portion 334 extended towards the outside from both sides of the mounting portions.

Further, the transformation portion 335a of the rear plate 331 can be transformed through a position and a structure thereof, for implementation of folding or unfolding of the flexible display unit 330. Also, a bonding member 337 is installed between the flexible display unit 330 and the mounting portions 333a, 333a' of the rear plate 331. These have been aforementioned, and thus detailed descriptions thereof will be omitted.

However, the flexible display device 300 according to this embodiment may also include the bending supporting portion 334 extended towards the outside from both sides of the mounting portions 333a, 333a' of the rear plate 331. Here, an outer side surface of the bending supporting portion 334 may have a flat shape.

In addition, a molding member 336 can be coupled to an upper surface of the bending supporting portion 334. A bottom surface of the molding member 336 may have a flat shape to correspond to the upper surface of the bending supporting portion 334, and an upper surface thereof may have a concavo-convex shape.

When folding of the rear plate 331 is performed in an opposite direction to folding of the flexible display unit 330, interference occurs at the concavo-convex structure formed on the upper surface of the molding member 336. As a result, folding of the rear plate 331 in the opposite direction to folding of the flexible display unit 330 can be restricted. That is, the molding member 336 prevents counter-folding of the rear plate 331.

Further, the molding member 336 can maintain its parallel state when the flexible display unit 330 is unfolded, and maintain its bent state when the flexible display unit 330 is folded. The molding member 336 may include a material such as synthetic resin.

The aforementioned flexible display device is not limited to the configurations and the methods of the embodiments described above, but all or some of the embodiments may be selectively combined so that various modifications can be made.

What is claimed is:

1. A flexible display device, comprising:
a first body;
a second body;
a flexible display unit arranged on a surface of the first body and the second body; and
a hinge unit connecting the first body and the second body to each other such that the first body and the second body can be folded and unfolded with respect to each other,
wherein the hinge unit includes a plurality of hinge segments such that in a folding state of the flexible display unit, the second body is arranged to cover a rear surface of the first body as an interval between the hinge segments is increased, and in an unfolded state of the flexible display unit, the first body and the second body are arranged in parallel with the interval between the hinge segments being decreased,
wherein a rear plate is coupled to a rear surface of the flexible display unit, and is configured to support the flexible display unit,
wherein the rear plate includes:
mounting portions extended in one direction, and recessed to couple the rear surface of the flexible display unit and
transformation portions having a plurality of extension bars arranged in parallel so as to cross the mounting portions, and being transformed in correspondence to the flexible display unit, and
wherein the mounting portions placed on both sides are connected by the transformation portions placed between the mounting portions.

2. The flexible display device of claim 1, wherein in the unfolded state of the flexible display unit, the flexible display unit covers the hinge unit.

3. The flexible display device of claim 1, wherein the hinge segments are sequentially arranged in one direction, and enclose a side surface of the first body in the folding state of the flexible display unit.

4. The flexible display device of claim 1, further comprising:
a bonding member formed between an upper surface of the rear plate and a bottom surface of the flexible display unit.

5. The flexible display device of claim 1, wherein the rear plate further includes:
a bending supporting portion extended towards the outside from both sides of the mounting portions.

6. The flexible display device of claim 5, wherein the bending supporting portion is concaved downward, and
wherein a metallic supporting member is coupled to a bottom surface of the bending supporting portion, in correspondence to a shape of the bottom surface.

7. The flexible display device of claim 5, further comprising:

a molding member having a concavo-convex shape coupled to an upper surface of the bending supporting portion.

8. The flexible display device of claim 5, wherein the plurality of extension bars are arranged in parallel and spaced apart from each other by predetermined intervals, so as to be transformed in correspondence to folding and unfolding of the flexible display unit.

9. The flexible display device of claim 1, wherein the first body includes:
a first part; and
a second part arranged to be slidable by a predetermined distance along the first part.

10. The flexible display device of claim 9, wherein the first body further includes:
a plurality of links installed between the first part and the second part, and connected to each other so as to be relatively rotatable; and
an elastic member extended or contracted in correspondence to a movement of the plurality of links.

11. The flexible display device of claim 9, wherein the flexible display unit is fixedly-coupled to the first part and the second body.

12. The flexible display device of claim 1, wherein the first body includes a plurality of parts connected to each other so as to be relatively moveable when changing between the folding and unfolding states.

13. The flexible display device of claim 12, wherein the plurality of parts include a first part and a second part that slides along the first part when changing between the folding and unfolding states.

14. The flexible display device of claim 13, wherein the flexible display unit is fixedly-coupled to the first part.

15. The flexible display device of claim 1, wherein the hinge unit is exposed when the flexible display is in the folded state.

16. The flexible display device of claim 1, wherein the hinge segments are sequentially arranged in one direction, and
wherein each hinge segment includes a first magnet at a first side and a second magnet at a second side.

17. The flexible display device of claim 16, wherein in the unfolded state of the flexible display unit, the second magnet of a first hinge segment is adjacent to the first magnet of a second hinge segment in the sequentially arranged hinge segments.

18. The flexible display device of claim 17, wherein in the folded state of the flexible display unit, the second magnet of the first hinge segment is spaced apart from the first magnet of the second hinge segment in the sequentially arranged hinge segments.

19. The flexible display device of claim 17, wherein the first and second magnets have opposite polarities to attract the hinge segments to be adjacent to each other.

20. A flexible display device, comprising:
a first body;
a second body;
a flexible display unit arranged on a surface of the first body and the second body; and
a hinge unit connecting the first body and the second body to each other such that the first body and the second body can be folded and unfolded with respect to each other,
wherein the hinge unit includes a plurality of hinge segments such that in a folding state of the flexible display unit, the second body is arranged to cover a rear surface of the first body as an interval between the hinge segments is increased, and in an unfolded state of the flexible display unit, the first body and the second body are arranged in parallel with the interval between the hinge segments being decreased, wherein the first body includes:

a first part; and a second part arranged to be slidable by a predetermined distance along the first part, and wherein the first body further includes:

a plurality of links installed between the first part and the second part, and connected to each other so as to be relatively rotatable; and an elastic member extended or contracted in correspondence to a movement of the plurality of links.

* * * * *